United States Patent
Ng et al.

(10) Patent No.: US 6,809,261 B1
(45) Date of Patent: Oct. 26, 2004

(54) PHYSICALLY COMPACT DEVICE PACKAGE

(75) Inventors: Kee Y an Ng, Penang (MY); Cheng Why Tan, P nang (MY); Ji Kin Tham, Penang (MY)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/602,418

(22) Filed: Jun. 23, 2003

(51) Int. Cl.[7] ............................................. H01L 23/24
(52) U.S. Cl. ..................... 174/52.2; 361/709; 361/718; 257/713
(58) Field of Search .............................. 174/52.1, 52.2, 174/52.3, 52.4; 361/709, 710, 711, 712, 717, 718, 719; 257/706, 707, 712, 713

(56) References Cited

U.S. PATENT DOCUMENTS

| | | | | |
|---|---|---|---|---|
| 4,965,660 A | * | 10/1990 | Ogihara et al. | 257/717 |
| 5,102,829 A | * | 4/1992 | Cohn | 29/837 |
| 5,355,283 A | * | 10/1994 | Marrs et al. | 361/760 |
| 5,784,260 A | * | 7/1998 | Fuller et al. | 361/762 |
| 5,834,839 A | * | 11/1998 | Mertol | 257/704 |
| 5,962,810 A | * | 10/1999 | Glenn | 174/52.2 |
| 6,023,098 A | * | 2/2000 | Higashiguchi et al. | 257/712 |

* cited by examiner

*Primary Examiner*—Dean A. Reichard
*Assistant Examiner*—Carmelo Oliva
(74) *Attorney, Agent, or Firm*—John L. Imperato

(57) ABSTRACT

A device package has a conductive substrate with at least one mounting site, and an insulating substrate with a first side on the side of the conductive substrate with the one or more mounting sites. The insulating substrate has at least one aperture providing access between a second side of the insulating substrate and the one or more mounting sites. The insulating substrate has one or more signal paths on the second side that couple the one or more apertures to one or more contact sites disposed about the insulating substrate. A series of conductive tabs is coupled to corresponding contact sites.

14 Claims, 2 Drawing Sheets

PHYSICALLY COMPACT DEVICE PACKAGE

BACKGROUND OF THE INVENTION

Device packages act as a heat sink to draw heat away from devices housed by the package, and provide a means for interfacing devices to a circuit board or other system. Heat sinking lowers the operating temperature of the devices, generally improving reliability and increasing the MTBF (mean time before failure) of the devices, as the MTBF generally increases as operating temperature is lowered.

In the known device package 10 shown in FIG. 1, a device 12 is mounted on a heat sink 14 that is embedded in a plastic body 16. The plastic body provides structural support for conductive leads 18 that interface the device to a circuit board external to the device package. As the plastic body is an insulator, heat conduction through the plastic body 16 is generally very poor. Furthermore, the plastic body increases the footprint X1 of the device package 10 beyond the footprint X2 of the heat sink, causing the device package to be larger than the heat sink. As a result, in this type of device package, the device does not benefit from reduced operating temperatures that would result were the heat sink to occupy the full footprint of the device package.

SUMMARY OF THE INVENTION

A device package constructed according to the embodiments of the present invention has a conductive substrate with at least one mounting site on a top-side, and an insulating substrate with a first side on the top side of the conductive substrate. The insulating substrate has at least one aperture providing access between a second side of the insulating substrate and the one or more mounting sites. The second side of the insulating substrate has one or more signal paths that couple the one or more apertures to contact sites disposed about the insulating substrate. Conductive tabs are coupled to corresponding contact sites.

DETAILED DESCRIPTION

Figure 1:
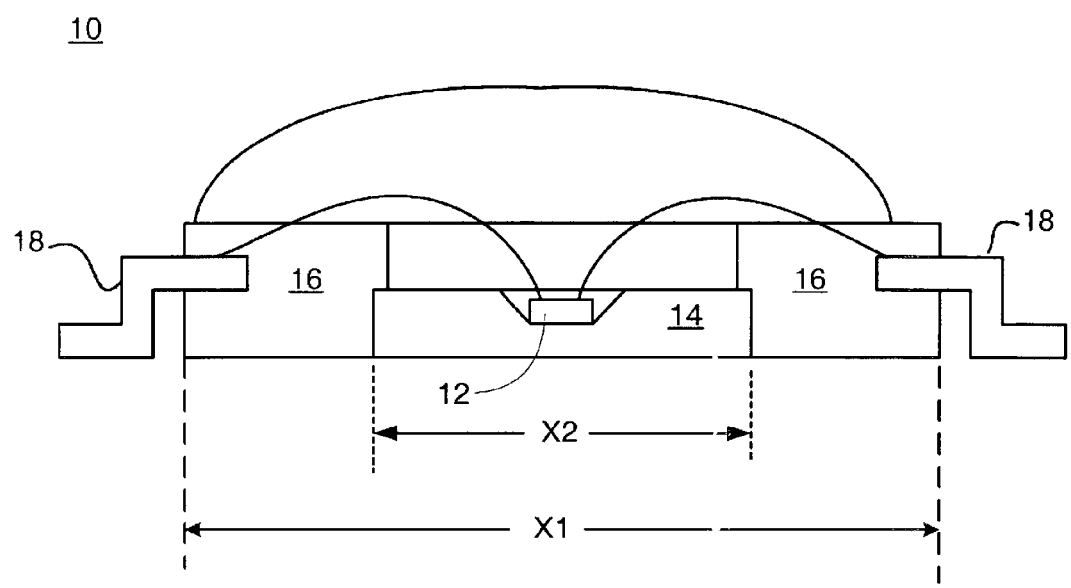
FIG. 1 shows a prior art device package.
Figure 2:
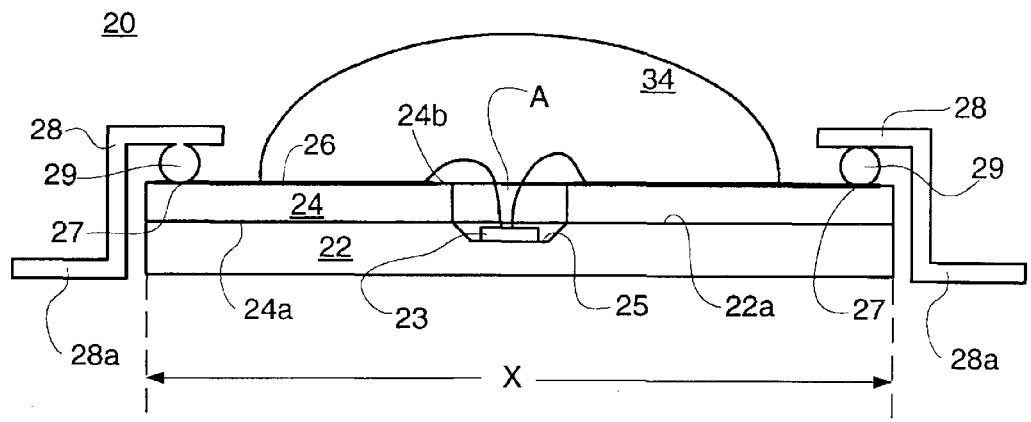
FIGS. 2–3 show device packages constructed according to embodiments of the present invention.

FIG. 2 shows a device package 20 constructed according to the embodiments of the present invention. The device package 20 includes a conductive substrate 22 that forms a heat sink for a device 23, when a device 23 is mounted on a mounting site 25 on a top side 22a of the conductive substrate 22. In this example, the mounting site 25 is recessed in the top side 22a, but the mounting site 25 is alternatively coplanar with the top side 22a of the conductive substrate 22, or even protruding above the top side 22a. In each of these alternative configurations, the mounting site 25 is still considered to be on the top side 22a of the conductive substrate 22. In the device package 20 (and the device package 30 shown in FIG. 3), the conductive substrate 22 forms a heat sink that defines the footprint X of the device packages 20, 30. In the example shown, the mounting site 25 is shown having optionally included sloped or curved walls that form an optical reflector for the device 23, in the event that the device 23 is an optical device.

An insulating substrate 24 is layered on the top side 22a of the conductive substrate 22, with a bottom side 24a of the insulating substrate 24 proximate to the top side 22a of the conductive substrate 22. The insulating substrate 24 is typically layered on the top side 22a using polymer-based adhesives, inorganic-based adhesives or solder. However, the insulating substrate 24 can be vapor-deposited or can otherwise be created or positioned onto the top side 22a of the conductive substrate 22.

The insulating substrate 24 has an aperture A providing access between a top side 24b of the insulating substrate 24 and the device 23 mounted at the mounting site 25, when such device 23 is present in the device package 20. While one aperture A is shown, the insulating substrate 24 alternatively has multiple apertures, for example, to accommodate multiple mounting sites 25 on the top side 22a of the conductive substrate 22 in the event that there are multiple mounting sites 25 dispersed on the top side 22a of the conductive substrate 22. In to the example shown, a device 23 is positioned at the mounting site 25 and wire bonds pass through the aperture A, coupling the device 23 to traces, or signal paths 26 on the top side 24b of the insulating substrate 24.

The signal paths 26 typically provide conductive coupling between the region of aperture A and corresponding contact sites 27 disposed about the periphery of the insulating substrate 24. The contact sites 27 in turn have corresponding conductive tabs 28 that are coupled to the contact sites 27. The conductive tabs 28 shown in FIG. 2 are gull-wings. These conductive tabs 28 are coupled to corresponding contact sites 27 using solder balls 29, as shown, or the conductive tabs 28 are coupled to corresponding contact sites 27 via conductive epoxy, spot welding, solder, mechanical fasteners or other conductive couplers. The gull-wings have leads 28a that are sufficiently parallel to the conductive substrate 22 (shown in FIG. 2) to form the device package 20 into a configuration compatible with surface mount technologies or processes. In the configuration compatible with surface mount technologies or processes, the leads 28a of the gull-wings protrude from the footprint X of the device package 20 as shown in FIG. 2, or the leads 28a are folded under the conductive substrate 22. Alternatively, the leads 28a of the gull-wings are sufficiently perpendicular to the conductive substrate 22 to form the device package 20 into a configuration compatible with thru-hole technologies or processes.

Figure 3:
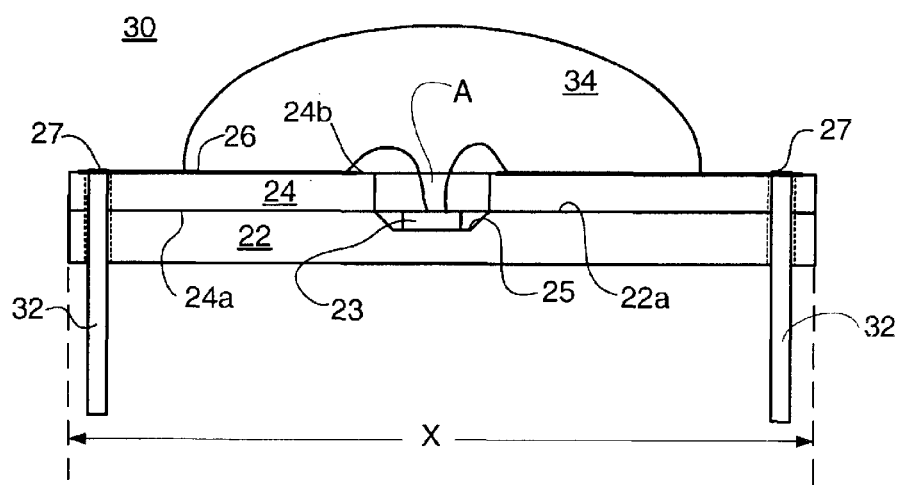

The conductive tabs 32 shown in the device package 30 of FIG. 3 are posts that are coupled to the contact sites 27 via conductive epoxy, spot welding, solder, mechanical fasteners or other conductive couplers. The conductive tabs 32 penetrate the conductive substrate 22 and insulating substrate 24 and form the device package 30 into a configuration compatible with thru-hole technologies or processes.

One or more contact sites 27 of the device packages 20, 30 are optionally grounded to the conductive substrate 22, depending on the type of device 23 mounted at the mounting site 25, or the requirements of the system within which the device packages 20, 30 are included.

In one example, the device 23 mounted on the mounting site 25 is an optical device such as an LED, photodetector or laser diode, and an optionally-included encapsulant 34 is covering the device 23. When included with the device packages 20, 30, the encapsulant is sufficiently transmissive to pass signals emitted from, or received by, the device 23 and can be chosen based on suitable electrical, optical, thermal and/or mechanical properties.

In another example, the encapsulant is a cap that is positioned on the top side 24b of the insulating substrate 24 to enclose or otherwise cover the mounting site 25 and the device 23. The characteristics and shape of the cap is chosen according to the device 23 included in the device package 20, 30. In the example where the device 23 is an optical device, the cap is lens-shaped, rectangular, or other suitable shape.

In another example, the device 23 is an array or cluster of optical devices that are mounted on one or more mounting sites 25. In other examples, the device 23 and/or optionally included encapsulant 34 include one or more LEDs and wavelength-converting material such as inorganic and/or organic fluorescent dyes suitable for forming white light emitters.

While the embodiments of the present invention have been illustrated in detail, it should be apparent that modifications and adaptations to these embodiments may occur to one skilled in the art without departing from the scope of the present invention as set forth in the following claims.

What is claimed is:

1. A device package, comprising:
   a conductive substrate having a bottom side defining a footprint of the device package and having a top side with at least one mounting site;
   an insulating substrate with a first side on the top side of the conductive substrate, the insulating substrate having at least one aperture providing access between a second side of the insulating substrate and the at least one mounting site, the insulating substrate having one or more signal paths on the second side coupling the at least one aperture to one or more contact sites disposed about the insulating substrate; and
   a series of conductive tabs, each of the conductive tabs coupled to a corresponding one of the one or more contact sites.

2. The device package of claim 1 further comprising at least one optical device mounted at the at least one mounting site.

3. The device package of claim 2 wherein the at least one optical device includes at least one of an LED, photodetector and laser diode.

4. The device package of claim 3 further comprising an encapsulant covering the at least one aperture on the second side of the insulating substrate.

5. The device package of claim 4 wherein the conductive tabs are gull-wings disposed about the periphery of the conductive substrate.

6. The device package of claim 4 wherein the conductive tabs are posts that penetrate the conductive substrate.

7. The device package of claim 3 wherein the conductive tabs are gull-wings disposed about the periphery of the conductive substrate.

8. The device package of claim 3 wherein the conductive tabs are posts that penetrate the conductive substrate.

9. The device package of claim 2 wherein the conductive tabs are gull-wings disposed about the periphery of the conductive substrate.

10. The device package of claim 2 wherein the conductive tabs are posts that penetrate the conductive substrate.

11. The device package of claim 2 wherein one or more of the one or more conductive tabs are grounded to the conductive substrate.

12. The device package of claim 1 wherein the conductive tabs are gull-wings disposed about the periphery of the conductive substrate.

13. The device package of claim 1 wherein the conductive tabs are posts that penetrate the conductive substrate.

14. The device package of claim 1 wherein one or more of the one or more conductive tabs are grounded to the conductive substrate.

* * * * *